(12) United States Patent
Han et al.

(10) Patent No.: US 10,516,013 B2
(45) Date of Patent: Dec. 24, 2019

(54) ULTRA HIGH DENSITY TRANSPARENT FLAT PANEL DISPLAY

(71) Applicant: LG Display Co., Ltd., Seoul (KR)

(72) Inventors: Sungman Han, Paju-si (KR); Eunji Park, Wonju-si (KR); Kihyung Lee, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/815,909

(22) Filed: Nov. 17, 2017

(65) Prior Publication Data

US 2018/0151649 A1 May 31, 2018

(30) Foreign Application Priority Data

Nov. 29, 2016 (KR) .......................... 10-2016-0160843

(51) Int. Cl.
| | |
|---|---|
| *H01L 27/32* | (2006.01) |
| *H01L 51/50* | (2006.01) |
| *G09G 3/20* | (2006.01) |
| *G09G 3/3233* | (2016.01) |

(52) U.S. Cl.
CPC .......... *H01L 27/3248* (2013.01); *G09G 3/20* (2013.01); *G09G 3/3233* (2013.01); *H01L 27/3262* (2013.01); *H01L 27/3276* (2013.01); *H01L 51/50* (2013.01); *G09G 2300/0426* (2013.01); *G09G 2300/0452* (2013.01); *G09G 2300/0819* (2013.01); *G09G 2320/0209* (2013.01); *G09G 2320/0295* (2013.01); *H01L 27/326* (2013.01)

(58) Field of Classification Search
CPC ................................. H01L 27/3276

USPC ....................................... 257/40, 59
See application file for complete search history.

(56) References Cited

U.S. PATENT DOCUMENTS

| | | | | |
|---|---|---|---|---|
| 2007/0048886 | A1* | 3/2007 | Winters | H01L 51/5228 438/29 |
| 2007/0080417 | A1* | 4/2007 | Jung | H01L 27/3269 257/448 |
| 2014/0183479 | A1* | 7/2014 | Park | H01L 51/56 257/40 |
| 2016/0035811 | A1* | 2/2016 | Choi | H01L 51/5221 257/72 |

FOREIGN PATENT DOCUMENTS

EP 3057085 A1 8/2016

OTHER PUBLICATIONS

Extended European Search Report dated Apr. 16, 2018, issued in corresponding European Patent Application No. 17204289.7.

* cited by examiner

*Primary Examiner* — Lex H Malsawma
*Assistant Examiner* — Eric W Jones
(74) *Attorney, Agent, or Firm* — Morgan, Lewis & Bockius LLP

(57) ABSTRACT

The present disclosure relates to an ultra high density transparent flat panel display. The present disclosure provides a transparent flat panel display including: a driving current line, a data line and a sensing line running in a vertical direction on a substrate; a scan line and a horizontal sensing line running in a horizontal direction on the substrate; an emission area disposed between the driving current line and the data line; and a transparent area disposed between the data line and the sensing line.

9 Claims, 6 Drawing Sheets

Related Art

FIG. 4

Related Art

ULTRA HIGH DENSITY TRANSPARENT FLAT PANEL DISPLAY

CROSS-REFERENCE TO RELATED APPLICATIONS

This application claims the benefit of Korea Patent Application No. 10-2016-0160843 filed on Nov. 29, 2016, which is incorporated herein by reference for all purposes as if fully set forth herein.

BACKGROUND

Technical Field

The present disclosure relates to an ultra high density transparent flat panel display. Especially, the present disclosure relates to a transparent organic light emitting diode display having the ultra high density.

Description of the Related Art

Nowadays, various flat panel displays (or "FPD") are developed for overcoming many drawbacks of the cathode ray tube (or "CRT") which is heavy and bulky. The flat panel display devices include the liquid crystal display device (or "LCD"), the field emission display (or "FED"), the plasma display panel (or "PDP"), the electro-luminescence device (or "EL") and so on.

As a self-emitting display device, the electro-luminescence device has the merits that the response speed is very fast, the brightness is very high and the view angle is large. The electro-luminescence device can be categorized an inorganic light emitting diode display and an organic light emitting diode display (or "OLED"). As having the good energy efficiencies, the lower leaked current and the easiness for representing color and brightness by current controlling, the OLED using the organic light emitting diode is more required.

Figure 1:
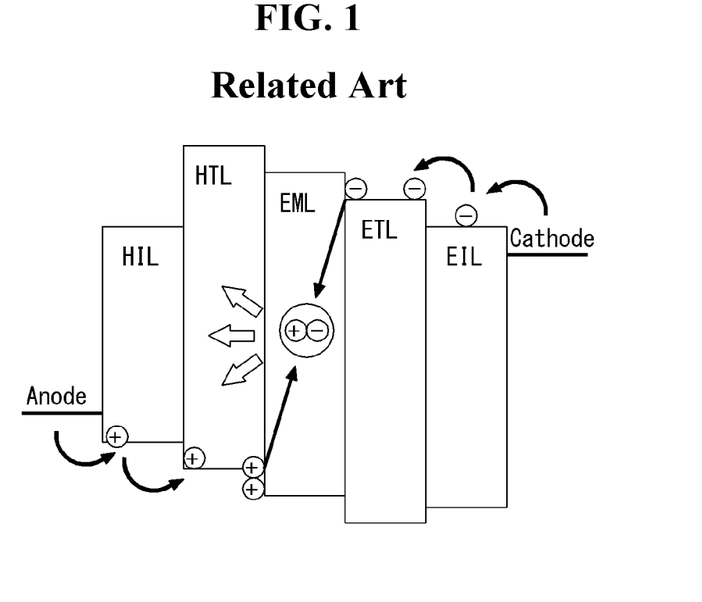
FIG. 1 is a diagram illustrating the structure of the organic light emitting diode according to the related art.

FIG. 1 is a diagram illustrating the structure of the organic light emitting diode. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL. The organic light emitting diode radiates the lights due to the energy from the excition formed at the excitation state in which the hole and the electron are recombined at the emission layer EML.

The organic light emitting diode radiates the lights due to the energy from the excition formed at the excitation state in which the hole from the anode and the electron from the cathode are recombined at the emission layer EML. The organic light emitting diode display can represent the video data by controlling the amount (or 'brightness') of the light generated and radiated from the emission layer EML of the organic light emitting diode as shown in FIG. 1.

The OLED using the organic light emitting diode having the good energy efficiencies can be categorized into the passive matrix type organic light emitting diode display (or PMOLED) and the active matrix type organic light emitting diode display (or AMOLED).

The active matrix type organic light emitting diode display (or AMOLED) shows the video data by controlling the current applying to the organic light emitting diode using the thin film transistor (or TFT). Hereinafter referring to FIGS. 2 and 3, we will explain about the organic light emitting diode display according to the related art.

Figure 2:
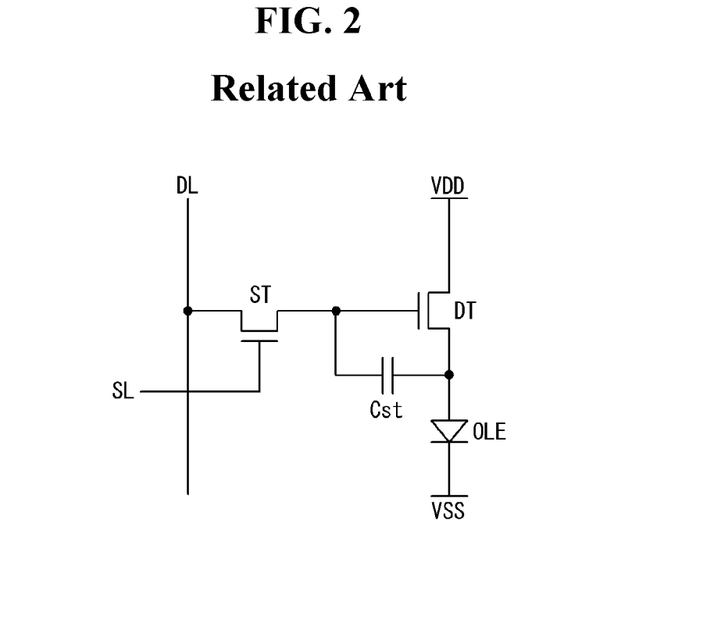
FIG. 2 is the exemplary circuit diagram illustrating the structure of one pixel in the active matrix organic light emitting diode display (or AMOLED) according to the related art.
Figure 3:
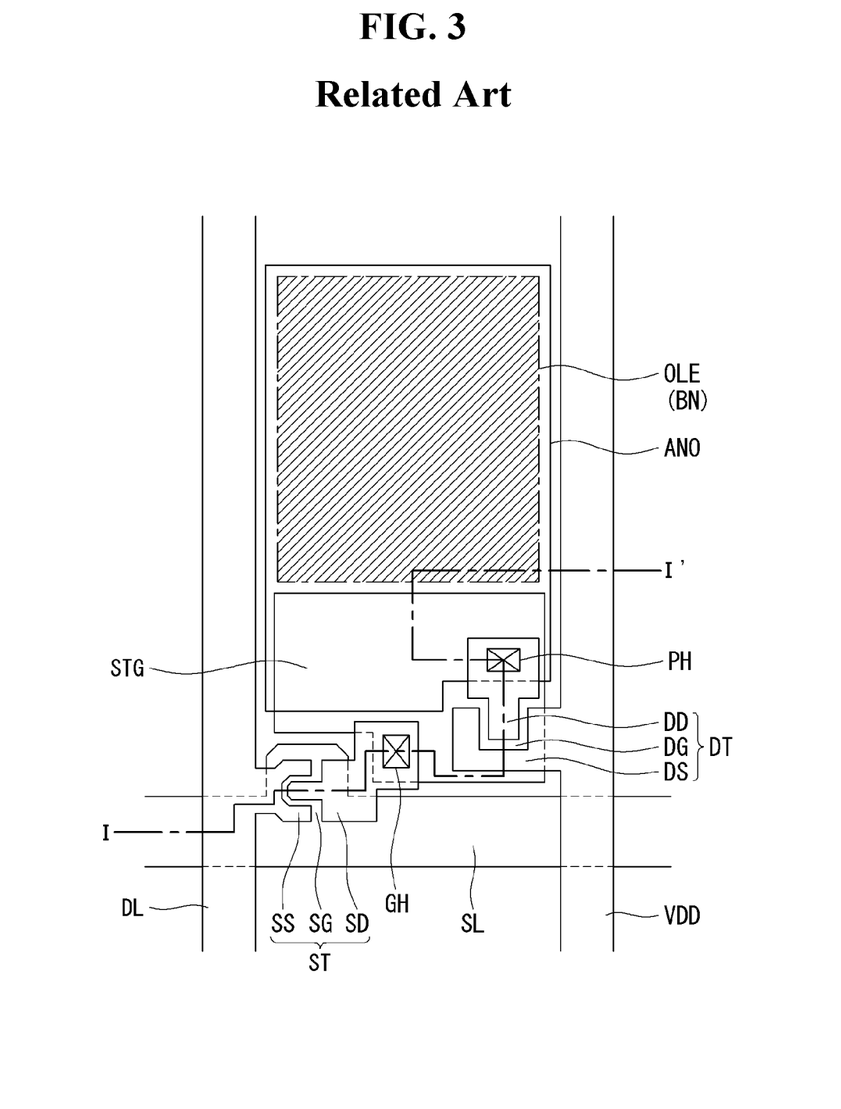
FIG. 3 is a plane view illustrating the structure of one pixel in the AMOLED according to the related art.
Figure 4:
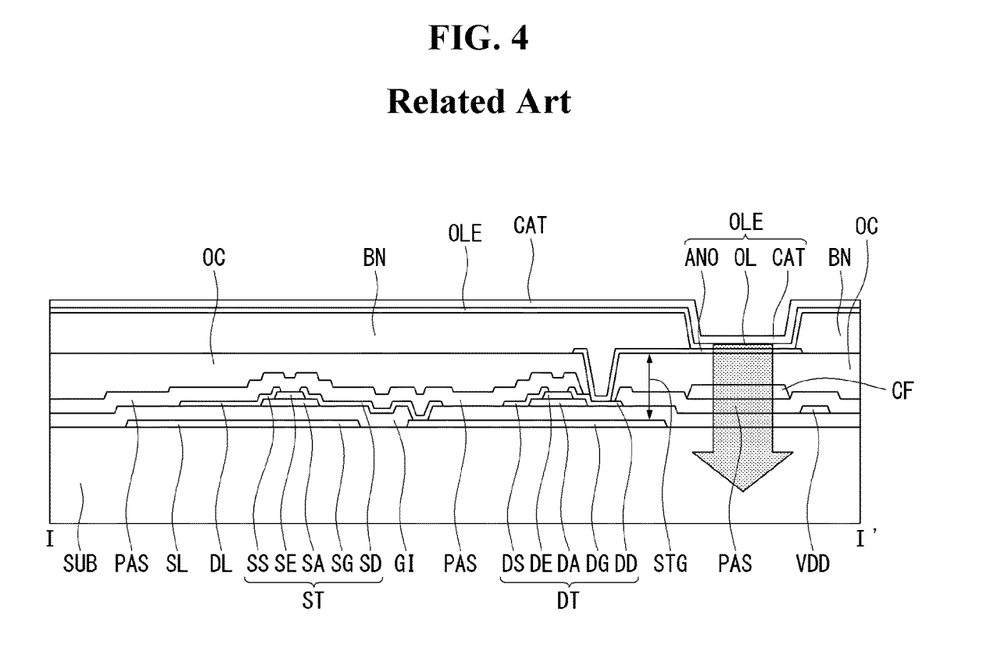
FIG. 4 is a cross sectional view along the cutting line I-I' for illustrating the structure of the bottom emission type AMOLED according to the related art.

FIG. 2 is the exemplary circuit diagram illustrating the structure of one pixel in the active matrix organic light emitting diode display (or AMOLED). FIG. 3 is a plane view illustrating the structure of the AMOLED according to the related art. FIG. 4 is a cross sectional view along the cutting line I-I' for illustrating the structure of the bottom emission type AMOLED according to the related art.

Referring to FIGS. 2 and 3, the active matrix organic light emitting diode display comprises a switching thin film transistor ST, a driving thin film transistor DT connected to the switching thin film transistor ST, and an organic light emitting diode OLE connected to the driving thin film transistor DT. By depositing a scan line SL, a data line DL and the driving current line VDD on a substrate, a pixel area is defined. As an organic light emitting diode is disposed within the pixel area, it defines an emission area.

The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OLE disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE. Between the anode electrode ANO and the cathode electrode CAT, an organic light emitting layer OL is disposed. The base (or low) voltage line VSS is connected to the cathode electrode CAT. A storage capacitance Cst is formed between the gate electrode DG of the driving thin film transistor DT and the driving current line VDD or between the gate electrode DG of the driving thin film transistor DT and the drain electrode DD of the driving thin film transistor DT.

Referring to FIG. 4, we will explain about the bottom emission type organic light emitting diode display. On the substrate SUB of the active matrix organic light emitting diode display, the gate electrodes SG and DG of the switching thin film transistor ST and the driving thin film transistor DT, respectively are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the gate contact hole GH penetrating the gate insulator GI. The passivation layer PAS is deposited on the substrate SUB having the switching thin film transistor ST and the driving thin film transistor DT.

The upper surface of the substrate SUB having these thin film transistors ST and DT is not in even and/or smooth conditions, but in uneven and/or rugged conditions having many steps. In order to get best light emitting efficiency, the organic light emitting layer OL would be deposited on an even or planar surface. So, to make the upper surface in planar and even conditions, the over coat layer OC is deposited on the whole surface of the substrate SUB.

Then, on the over coat layer OC, the anode electrode ANO of the organic light emitting diode OLE is formed. Here, the anode electrode ANO is connected to the drain electrode DD of the driving thin film transistor DT through the pixel contact hole PH penetrating the over coat layer OC and the passivation layer PAS.

On the substrate SUB having the anode electrode ANO, a bank BN is formed over the area having the switching thin film transistor ST, the driving thin film transistor DT and the various lines DL, SL and VDD, for defining the light emitting area. The exposed portion of the anode electrode ANO by the bank BN would be the light emitting area. The organic light emitting layer OL is deposited on the anode electrode ANO exposed by the bank BN. On the organic light emitting layer OL, a cathode electrode CAT is deposited.

A spacer is disposed on the substrate SUB having the cathode electrode CAT. It is preferable that the spacer is disposed on the bank BN, non-emission area. With the spacer, an en-cap is joined on the lower substrate SUB. For attaching the en-cap and the lower substrate SUB, an adhesive layer or adhesion material (not shown) would be deposited there-between.

For the bottom emission type organic light emitting diode display, the lights from the organic light emitting layer OL would be radiated to the lower substrate SUB. Therefore, it is preferable that a color filter CF is disposed between the overcoat layer OC and the passivation layer PAS and the anode electrode ANO includes a transparent conductive material. Further, the cathode electrode CAT preferably includes a metal material having the high reflection property for reflecting the lights from the organic light emitting layer OL to bottom side. In addition, the organic light emitting layer OL and the cathode electrode CAT would be deposited as covering the whole surface of the substrate.

The cathode electrode CAT is supplied with the reference voltage of the organic light emitting diode OLE. For ensuring the stable operation of the organic light emitting diode OLE, the reference voltage should be kept in stable voltage without flickers. To do so, it is preferable that the cathode electrode CAT has the low resistance metal material and is deposited over the whole surface of the substrate SUB.

When the organic light emitting diode display according to the related art is used for a long time, the video quality may be degraded due to the change of the electric characteristics of the pixels. The compensation elements for recovering these defects are required by detecting the changes of the electric characteristics.

In the cases that these compensation elements or circuits are installed into the pixel area, it may cause the reduction of the aperture ratio which is the ratio of the emission area to the pixel area. For the ultra high resolution display including UHD or 4K, the pixel area includes the switching thin film transistor, the driving thin film transistor and the compensation thin film transistor so that the aperture ration is remarkably reduced. It is required that the new structure of the organic light emitting diode display which ensures the high aperture ratio with the ultra high density resolution.

In addition, the organic light emitting diode display would be applied to the specific displays having unique function such as a transparent display in which the display images and/or information are represented with the background views of the display. However, the specifically used displays should have the more unique features than the general purpose organic light emitting diode display for realizing their specific purposes. For example, a transparent organic light emitting diode display having an ultra high density is more needed.

SUMMARY

Accordingly, embodiments of the present disclosure are directed to an ultra high density transparent flat panel display that substantially obviates one or more of the problems due to limitations and disadvantages of the related art.

An aspect of the present disclosure is to provide an ultra high density transparent organic light emitting diode display. Another aspect of the present disclosure is to provide an ultra high density transparent organic light emitting diode display having a high aperture ration. Still another aspect of the present disclosure is to suggest a transparent organic light emitting diode display providing better video quality by minimizing the effects between the lines even though the gaps between the lines are closer.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a transparent flat panel display comprises a driving current line, a data line and a sensing line running in a vertical direction on a substrate; a scan line and a horizontal sensing line running in a horizontal direction on the substrate; an emission area disposed between the driving current line and the data line; and a transparent area disposed between the data line and the sensing line.

In one embodiment, the data line includes a first data line, a second data line, a third data line and a fourth data line, a first emission area and a second emission area are disposed between the first data line and the second data line, and a third emission area and a fourth emission area are disposed between the third data line and the fourth data line.

In one embodiment, the transparent display further comprises: a base voltage line disposed between the data line and the transparent area.

In one embodiment, the low voltage line includes an opaque metal material and connected to the cathode electrode.

In one embodiment, the data line is disposed at one side of the driving current line and the sensing line is disposed at another side of the driving current line.

In one embodiment, the scan line includes a first scan line and a second scan line disposed as closing each other, and a horizontal sensing line is branched from the sensing line and disposed between the first scan line and the second scan line.

In one embodiment, the first emission area is disposed at a first pixel area defined by the first data line, the second data line and the first scan line, the second emission area is disposed at a second pixel area defined by the first data line, the second data line and the second scan line, the third emission area is disposed at a third pixel area defined by the third data line, the fourth data line and the first scan line, and the fourth emission area is disposed at a fourth pixel area defined by the third data line, the fourth data line and the second scan line.

In one embodiment, the emission area includes: a switching thin film transistor, a driving thin film transistor, a sensing thin film transistor, a storage capacitance and an organic light emitting diode.

In one embodiment, the switching thin film transistor, the driving thin film transistor, the sensing thin film transistor and the storage capacitance are disposed under the organic light emitting diode.

In one embodiment, the organic light emitting diode includes: an anode electrode connected to the driving thin film transistor and including an opaque reflective metal material; an organic light emitting layer deposited on the anode electrode; and a cathode electrode including a transparent conductive material and deposited on the organic light emitting layer.

The organic light emitting diode display according to the present disclosure includes a compensation thin film transistor for controlling the conditions of the driving thin film transistor and/or the organic light emitting diode by detecting the degradation of the pixel. Under the hard condition causing the deterioration of the pixel, the video quality can be kept in superior conditions. The transparent organic light emitting diode display according to the present disclosure relates to the top emission type organic light emitting diode display in which the emission area is defined as occupying the most all areas of the pixel area. The transparent area is disposed as being separated from the pixel area. Therefore, for the ultra high density, the emission area can be maximized so that the high aperture ratio can be acquired. In addition, as the gaps between lines are closer as the pixel density is getting higher, the sensing line can be disposed as being far away from the data lines. As the results, the sensing signal is not affected by the data voltage which is frequently changed and then the superior video quality can be ensured.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 5:
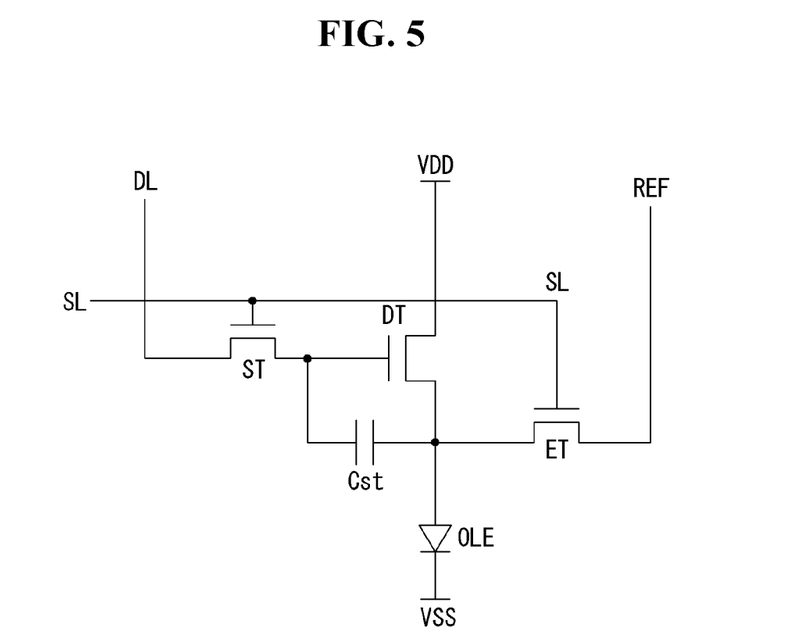
FIG. 5 is an equivalent circuit diagram illustrating a structure of one pixel in the organic light emitting diode display having a compensation element according to the present disclosure.

Hereinafter, referring to FIG. 5, we will explain about the present disclosure. FIG. 5 is an equivalent circuit diagram illustrating a structure of one pixel in the organic light emitting diode display having a compensation element according to the present disclosure.

Referring to FIG. 5, one pixel of the organic light emitting diode display comprises a switching thin film transistor ST, a driving thin film transistor DT, a storage capacitance Cst, a compensation element and an organic light emitting diode OLE. The compensation element may be configured in a various method. Here, we explain about the case that the compensation element includes a sensing thin film transistor ET and a sensing line REF.

Responding to the scan signal supplied from the scan line SL, the switching thin film transistor ST works as a switching operation for storing the data signal from the data line DL to the storage capacitance Cst as the data voltage. According to the data voltage in the storage capacitance Cst, the driving thin film transistor DT works for supplying the driving current between the driving current line VDD (supplying the variable high level voltage) and the base voltage line VSS (supplying the constant low level voltage). The organic light emitting diode OLE works as generating the lights according to the driving current formed by the driving thin film transistor DT.

The sensing thin film transistor ET is an additional element disposed within the pixel area for compensating the threshold voltage of the driving thin film transistor DT. The sensing thin film transistor ET is connected between the drain electrode of the driving thin film transistor DT and the anode electrode (or the sensing node) of the organic light emitting diode OLE. The sensing thin film transistor ET works for supplying the initial voltage (or the sensing voltage) from the sensing line REF to the sensing node or for detecting (or sensing) the voltage or current at the sensing node.

The switching thin film transistor ST includes a source electrode connected to the data line DL, and a drain electrode connected to the gate electrode of the driving thin film transistor DT. The driving thin film transistor DT includes a source electrode connected to the driving current line VDD, and a drain electrode connected to anode electrode of the organic light emitting diode OLE. The storage capacitance Cst includes a first electrode connected to the gate electrode of the driving thin film transistor DT, and a second electrode connected to the anode electrode of the organic light emitting diode OLE.

The organic light emitting diode OLE includes an anode electrode connected to the drain electrode of the driving thin film transistor DT, and a cathode electrode connected to the base (or low) voltage line VSS. The sensing transistor ET includes a source electrode connected to the sensing line REF, and a drain electrode connected to the sensing node (the anode electrode of the organic light emitting diode OLE).

The operating timing of the sensing thin film transistor ET may be related to that of the switching thin film transistor ST according to the compensation algorithm. For example, as shown in FIG. 5, the gate electrodes of the switching thin film transistor ST and the sensing thin film transistor ET may be connected to the scan line SL commonly. Otherwise, the gate electrode of the switching thin film transistor ST is connected to one scan line SL and the gate electrode of the sensing thin film transistor ET is connected to the other scan line (not shown).

According to the sensing results, the digital type data signal, the analog type data signal or gamma signal may be compensated. The compensation elements for generating the compensating signal (or the compensating voltage) based on the sensing results may be configured as the internal circuits embedded into the data driver or timing controller or the externally circuits.

FIG. 5 shows a pixel having the structure of 3T1C (three thin film transistor and one capacitance) including the switching thin film transistor ST, the driving thin film transistor DT, the sensing thin film transistor ET, the storage capacitance Cst and the organic light emitting diode OLE. Otherwise, the pixel may include additional compensating elements for example, 3T2C, 4T2C, 5T1C, 6T2C etc.

Hereinafter, we will explain about the structural features of the transparent organic light emitting diode display configured with the circuit diagram shown in FIG. 5 according to the present disclosure. In accordance with the real structure of the pixel, the aperture ratio may be different. As the degree of the resolution, the aperture ratio is very important for deciding the quality of the display. As the resolution of the display is increasing, the unit pixel area is getting smaller. The size of the thin film transistors and the width of the lines cannot be made small indefinitely. As the pixel area is smaller, the ratio of the emission area in the pixel area is smaller.

Further, when the compensating element is included into the pixel area, the aperture ratio, the ratio of the emission area to the pixel area, is much smaller. In addition, as the number of the pixels is increasing, the probability of the defected pixel is also increasing. The defected pixel is the main causes of the deterioration of the video quality. Therefore, it is preferable that the defected pixels are to be darkened so that the normal pixels are not affected by the defected pixels. For darkening the defected pixels, it is preferable to cut the connecting part between the thin film transistor and the organic light emitting diode. Hereinafter, we will explain about various structures of the organic light emitting diode display according to the present disclosure.

<First Embodiment>

Figure 6:
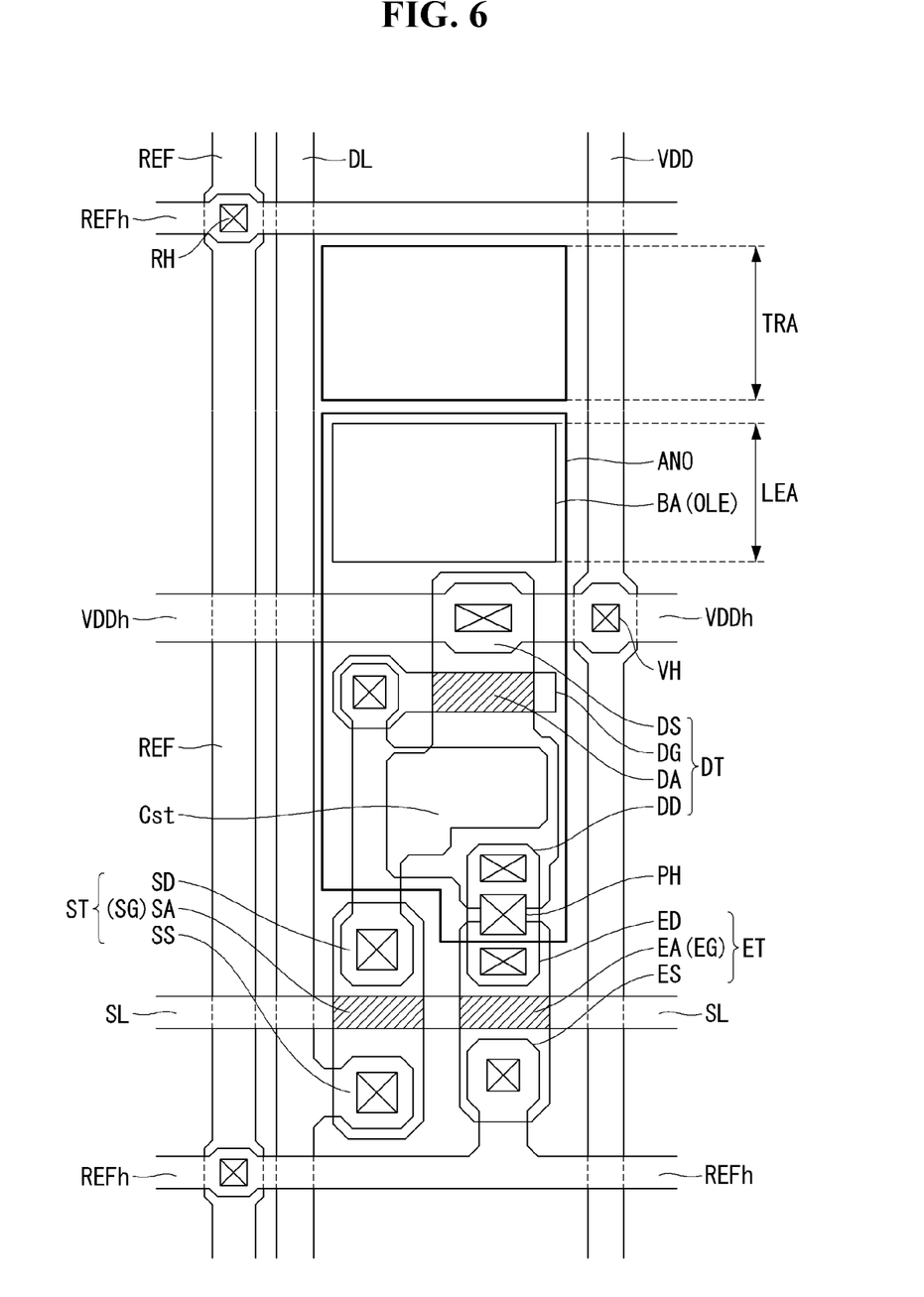
FIG. 6 is a plane view illustrating a structure of a transparent organic light emitting diode display having a compensation element according to the first embodiment of the present disclosure.

Referring to FIG. 6, we will explain about the first embodiment of the present disclosure. FIG. 6 is a plane view illustrating a structure of a transparent organic light emitting diode display having a compensation element according to the first embodiment of the present disclosure.

The transparent organic light emitting diode display according to the first embodiment of the present disclosure comprises a sensing line REF, a data line DL, a driving current line VDD, a horizontal sensing line REFh, a horizontal current line VDDh and a scan line SL on a substrate SUB. These lines define a pixel area. In detail, a unit pixel area is defined as an area surrounded by two neighboring horizontal sensing lines REFh, one data line DL and one driving current line VDD. These lines may be made of the opaque metal materials.

The transparent organic light emitting diode display comprises a transparent (or transmissive) area TRA and an emission area LEA. The transparent area TRA is an area through which the background views behind the display is provided transmittively. For example, it is an area that transparently transmits the background views beyond the display, like a glass, to the observer located in front of the display. The emission area LEA is an area for representing the image information or data provided from the display. For the transparent organic light emitting diode display, the emission area includes an organic light emitting diode.

The scan line SL, the horizontal sensing line REFh and the horizontal current line VDDh are running in horizontal direction on the substrate SUB. The data line DL, the driving current line VDD and the sensing line REF are running in vertical direction on the substrate SUB. The horizontal sensing line REFh is connected to the sensing line REF via a sensing contact hole RH. The horizontal current line VDDh is connected to the driving current line VDD via the current contact hole VH.

Between two neighboring horizontal sensing line REFh, the horizontal current line VDDh and the scan line SL are disposed. The area between the upper horizontal sensing line REFh and the horizontal current line VDDh is defined as an image area having the transparent area TRA and the emission area LEA. The area between the horizontal current line VDDh and the lower horizontal sensing line REFh is defined as the non-emission area. In the emission area LEA, an organic light emitting diode OLE is disposed. In the non-emission area, the thin film transistors ST, DT and ET and the storage capacitance Cst are disposed.

The switching thin film transistor ST includes a switching source electrode SS connected to the data line DL, a switching gate electrode SG defined at a part of the scan line SL, a switching semiconductor layer SA and a switching drain electrode SD. A channel area is defined at the overlapped area of the switching semiconductor layer SA with the switching gate electrode SG. As the switching semiconductor layer SA is disposed as crossing the scan line SL from the lower side to the upper side, the switching thin film transistor ST is formed.

The sensing thin film transistor ET includes a sensing source electrode ES connected to the horizontal sensing line REFh, a sensing gate electrode EG defined at a part of the scan line SL, a sensing semiconductor layer EA and a sensing drain electrode ED. A channel area is defined at the overlapped area of the sensing semiconductor layer EA with the sensing gate electrode EG. As the sensing semiconductor layer EA is disposed as crossing the scan line SL from the lower side to the upper side, the sensing thin film transistor ET is formed.

The driving thin film transistor DT includes a driving source electrode DS defined at a part of the horizontal current line VDDh, a driving gate electrode DG connected to the switching drain electrode SD, a driving semiconductor layer DA and a driving drain electrode DD. A channel area is defined at the overlapped area of the driving semiconductor layer DA with the driving gate electrode DG. As the driving semiconductor layer DA is disposed as crossing the driving gate electrode DG from the horizontal current line VDDh to the scan line SL, the driving thin film transistor DT is formed. The driving drain electrode DD is connected to the one portion of the driving semiconductor layer DA and one portion of the sensing semiconductor layer EA.

The storage capacitance Cst includes a first electrode and a second electrode. The first electrode is formed as some expanded portions of the switching gate electrode SG. The second electrode is formed as some expanded portions of the driving semiconductor layer DA to the scan line SL over the driving gate electrode DG. The driving thin film transistor DT and the storage capacitance Cst are disposed between the horizontal current line VDDh and the scan line SL. The driving elements are disposed between the horizontal current line VDDh and the horizontal sensing line REFh. This area is defined as the non-emission area.

The anode electrode ANO of the organic light emitting diode OLE is connected to the driving drain electrode DG through the pixel contact hole PH. The anode electrode ANO is disposed as covering the emission area LEA in the image area but not covering the transparent area TRA. The open area of the bank BA is defined as exposing a maximum area of the anode electrode ANO within the emission area LEA.

As ensuring the maximum area, the anode electrode ANO is occupying the most areas of the emission area LEA and some portions are expanded to the non-emission area. Specifically, it is preferable that the anode electrode ANO expands to the driving drain electrode DG. Further, the anode electrode ANO may be overlapped with the storage capacitance Cst. When it is hard to form the second electrode of the storage capacitance Cst with the driving semiconductor layer DA, the second electrode of the storage capacitance Cst may be formed by expanding the anode electrode ANO as overlapping with the first electrode.

Most parts of the anode electrode ANO are exposed by the bank BN. The organic light emitting diode OLE is formed by stacking the organic light emitting layer and the cathode electrode on the bank BN. It is preferable that the organic light emitting diode OLE is formed as having the maximum emission area within the pixel area. In addition, at the transparent area TRA, it is preferable that the organic light emitting layer OL and the cathode electrode CAT are not disposed. However, when the cathode electrode is made of a transparent conductive material, the cathode electrode CAT may be disposed at the transparent area TRA.

The transparent organic light emitting diode display having the sensing thin film transistor ET has very complex structure. Therefore, the ratio of the image area within a pixel area is very low. The image area is divided into two areas for the transparent area TRA and the emission area LEA. Therefore, the aperture ratio for representing video image is much lower. A new structure is desired for a transparent organic light emitting diode display having an ultra high aperture ratio.

Further, the organic light emitting diode display shown in FIG. 6 has the sensing line REF for the compensation elements. Specifically, the sensing line REF is disposed as closing to the data lines DL. The data lines DL are for providing the data voltages which are frequently changed or varied according to the video images. Therefore, the sensing line REF may easily affected by these frequently varying voltages. It is desired that the structure in which the sensing line REF is electrically isolated or insulated from the data lines DL.

As realizing the ultra high density display, the size of the pixel area is getting smaller and the gaps between the lines are getting narrower. Consequently, for the ultra high density transparent organic light emitting diode display, the structure for electrically isolating or insulating the sensing line REF from the data lines DL is more desired.

<Second Embodiment>

Figure 7:
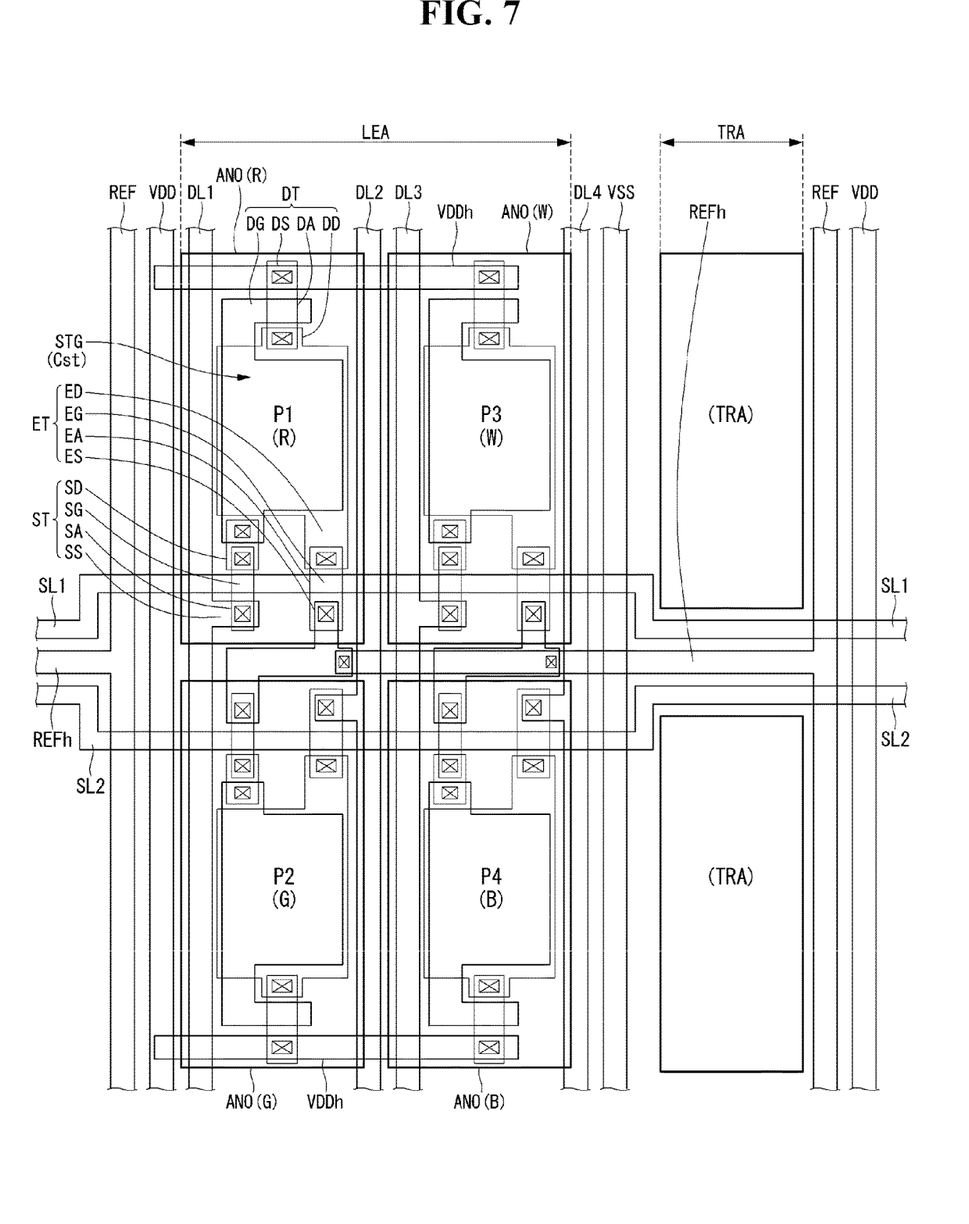
FIG. 7 is a plane view illustrating a structure of a transparent organic light emitting diode display according to the second embodiment of the present disclosure.

Hereinafter, referring to FIG. 7 we will explain about the second embodiment. FIG. 7 is a plane view illustrating a structure of a transparent organic light emitting diode display according to the second embodiment of the present disclosure. The second embodiment provides a structure in which the line gap between the sensing line and the data line is minimized for realizing the ultra high density transparent organic light emitting diode display.

Referring to FIG. 7, a transparent organic light emitting diode display according to the second embodiment of the present disclosure comprises a driving current line VDD, a first data line DL1, a second data line DL2, a third data line DL3, a fourth data line DL4, a base (or low) voltage line Vss and a sensing line REF, which are running to vertical direction on a substrate. The transparent organic light emitting diode display further comprises first scan line SL1, a second scan line SL2 and a horizontal sensing line REFh which are running to a horizontal direction on the substrate. These lines may be made of the opaque metal materials.

The first data line DL1 to the fourth data line DL4 are disposed between the driving current line VDD and the base (or low) voltage line Vss. The sensing line REF is disposed between the base voltage line Vss and a next driving current line VDD.

Between the driving current line VDD and the base voltage line Vss, the emission area LEA is disposed. Between the base voltage line Vss and the sensing line REF, the transparent area TRA is disposed. In another case, the base voltage line Vss is not disposed on the substrate. In that case, the emission area LEA may be disposed between the driving current line VDD and the fourth (last) data line DL4. The transparent area TRA may be disposed between the fourth data line DL4 and the sensing line REF.

The first scan line SL1 and the second scan line SL2 are crossing with the driving current line VDD, the data lines DL1 to DL4 and the sensing line REF. The first scan line SL1 and the second scan line SL2 are disposed as closing each other. Between the first scan line SL1 and the second scan line SL2, the horizontal sensing line REFh is disposed.

The transparent organic light emitting diode display according to the second embodiment of the present disclosure includes a unit pixel area having four sub pixel areas and two transparent areas. The unit pixel area is disposed between two neighboring sensing lines REF. Between the two neighboring sensing lines REF, the driving current line VDD, the four data lines DL1 to DL4 and the base voltage line Vss are disposed.

Between the first data line DL1 and the second data line DL2, a first pixel area P1 and a second pixel area P2 are disposed. Between the third data line DL3 and the fourth data line DL4, a third pixel area P3 and a fourth pixel area P4 are disposed. The first pixel area P1 is defined as being surrounded by the first data line DL1, the second data line DL2, the first scan line SL1 and the horizontal driving line VDDh. The second pixel area P2 is defined as being surrounded by the first data line DL1, the second data line DL2, the second scan line SL2 and the horizontal driving line VDDh. The third pixel area P3 is defined as being surrounded by the third data line DL3, the fourth data line DL4, the first scan line SL1 and the horizontal driving line VDDh. The fourth pixel area P4 is defined as being surrounded by the third data line DL3, the fourth data line DL4, the second scan line SL2 and the horizontal driving line VDDh.

A red sub pixel R may be allocated at the first pixel area P1, a green sub pixel G may be allocated at the second pixel area P2, a white sub pixel W may be allocated at the third pixel area P3 and a blue sub pixel B may be allocated at the fourth pixel area P4. Here, we explain about the case in which one unit pixel includes one red sub pixel R, one white sub pixel W, one green sub pixel G and one blue sub pixel B. However, it is not restricted this manner, various color sub pixel arrangement may be used.

At each pixel area P1 to P4, the thin film transistors ST, DT and ET, the storage capacitance STG and the organic light emitting diode OLE are disposed. The transparent organic light emitting diode display according to the second embodiment is the top emission type so that the thin film transistors ST, DT and ET are disposed under the organic light emitting diode OLE. The organic light emitting diode OLE includes an anode electrode ANO, an organic light emitting layer and a cathode electrode. The anode electrode is connected to the driving thin film transistor DT and includes an opaque reflective metal material. The organic emitting light layer is deposited on the anode electrode ANO. The cathode electrode includes a transparent conductive material and is deposited on the organic emitting layer. In order to ensure the emission area LEA to be maximized, some of the lines may be overlapped with the organic light emitting diode OLE.

Here, we explain about the first pixel area P1 mainly. The switching thin film transistor ST includes a switching source electrode SS connected to the first data line DL1, a switching gate electrode SG defined at a part of the first scan line SL1, a switching semiconductor layer SA and a switching drain electrode SD. The overlapped area of the switching semiconductor layer SA with the switching gate electrode SG is defined as the channel area. As the switching semiconductor layer SA is disposed as crossing the first scan line SL1 from the lower side to the upper side, the switching thin film transistor ST is formed.

The sensing thin film transistor ET includes a sensing source electrode ES connected to the horizontal sensing line REFh, a sensing gate electrode EG defined at another part of the first scan line SL1, a sensing semiconductor layer EA and a sensing drain electrode ED. A channel area is defined at the overlapped area of the sensing semiconductor layer EA with the sensing gate electrode EG. As the sensing semiconductor layer EA is disposed as crossing the first scan line SL1 from the lower side to the upper side, the sensing thin film transistor ET is formed.

The driving thin film transistor DT includes a driving source electrode DS defined at a part of the horizontal current line VDDh branched from the driving current line VDD, a driving gate electrode DG connected to the switching drain electrode SD, a driving semiconductor layer DA and a driving drain electrode DD. A channel area is defined at the overlapped area of the driving semiconductor layer DA with the driving gate electrode DG. As the driving semiconductor layer DA is disposed as crossing the driving gate electrode DG from the horizontal current line VDDh to the first scan line SL1, the driving thin film transistor DT is formed. The driving drain electrode DD is connected to the one portion of the driving semiconductor layer DA and one portion of the sensing semiconductor layer EA.

The storage capacitance Cst includes a first electrode and a second electrode. The first electrode is formed as some expanded portions of the switching gate electrode SG. The second electrode is formed as some expanded portions of the driving gate electrode DG. Between the first scan line SL1 and the horizontal current line VDDh, the first pixel area P1 including the thin film transistors ST, DT and ET and the storage capacitance Cst is disposed.

An anode electrode ANO is disposed at the first pixel area P1. Even though it is not shown in figure, a planar layer is deposited on the surface of the substrate having the thin film transistors ST, DT and ET and the storage capacitance Cst, and then the anode electrode ANO is formed on the planar layer. The anode electrode ANO is connected to the driving drain electrode DD of the driving thin film transistor DT. The anode electrode ANO may have a rectangular shape covering most of the first pixel area P1.

On the anode electrode ANO, a bank BN is formed for defining the emission area LEA. The open area formed at the bank BN defines the emission area LEA of the anode electrode ANO. On the emission area LEA, an organic light emitting layer is deposited. On the organic light emitting layer, a cathode electrode is deposited as covering whole surface of the substrate. At the emission area LEA, the organic light emitting diode OLE is formed as the anode electrode ANO, the organic light emitting layer and the cathode electrode are stacked sequentially.

In the transparent organic light emitting diode display according to the second embodiment, most of all areas of the pixel area would be defined as the emission area LEA. The transparent area TRA is disposed as being separated from the pixel area which is the emission area LEA. In detail, two transparent areas TRA are disposed next to the four pixel areas P1 to P4, as shown in FIG. 7.

In FIG. 7, the sensing line REF is disposed as being apart from the data line DL1 to DL4. For example, based on the driving current line VDD, the data lines DL1 to DL4 are disposed at one side from the driving current line VDD, and the sensing line REF is disposed at another side from the driving current line VDD. The sensing line REF is closer to the driving current line VDD than the data lines DL1 to DL4. The driving current line VDD supplies the voltage having constant value always, so that the voltage of the driving current line VDD is not affected to the sensing line REF. Further, the between the sensing line REF and the data lines DL1 to DL4, the transparent area TRA is disposed. Therefore, the sensing line REF is not affected by the data lines DL1 to DL4.

The transparent organic light emitting diode display according to the second embodiment of the present disclosure provide a structure in which the sensing line REF is disposed as being apart from the data lines DL1 to DL4 even though the gaps between lines are much closer as realizing the ultra high density structure. As the results, the sensing signal is not affected by the data voltages which are frequently changed, and then the superior video quality can be ensured.

While the embodiment of the present disclosure has been described in detail with reference to the drawings, it will be understood by those skilled in the art that the disclosure can be implemented in other specific forms without changing the technical spirit or essential features of the disclosure. Therefore, it should be noted that the forgoing embodiments are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A transparent flat panel display including a pixel, comprising:
    a driving current line, a data line, and a sensing line each connected to the pixel and running in a vertical direction on a substrate,
    wherein the data line provides a data voltage to the pixel, and the data voltage corresponds to image information for display by the pixel;
    a scan line and a horizontal sensing line running in a horizontal direction on the substrate;
    the pixel including an organic light emitting diode and a sensing thin film transistor, the organic light emitting diode being in an emission area disposed between the driving current line and the data line,
    wherein the sensing thin film transistor is controlled by the scan line and is connected between the organic light emitting diode and the sensing line; and
    a transparent area disposed between the data line and the sensing line,
    wherein the data line is disposed at one side of the driving current line and the sensing line is disposed at another side of the driving current line.

2. The transparent flat panel display according to claim 1, wherein the data line includes a first data line, a second data line, a third data line and a fourth data line,
    wherein a first emission area and a second emission area are disposed between the first data line and the second data line, and
    wherein a third emission area and a fourth emission area are disposed between the third data line and the fourth data line.

3. The transparent flat panel display according to claim 2, wherein the scan line includes a first scan line and a second scan line disposed as closing each other, and
    a horizontal sensing line is branched from the sensing line and disposed between the first scan line and the second scan line.

4. The transparent flat panel display according to claim 3, wherein the first emission area is disposed at a first pixel area defined by the first data line, the second data line and the first scan line,
    wherein the second emission area is disposed at a second pixel area defined by the first data line, the second data line and the second scan line,
    wherein the third emission area is disposed at a third pixel area defined by the third data line, the fourth data line and the first scan line, and
    wherein the fourth emission area is disposed at a fourth pixel area defined by the third data line, the fourth data line and the second scan line.

5. The transparent flat panel display according to claim 1, further comprising:
    a base voltage line connected to the pixel, running in a vertical direction, and disposed between the data line and the transparent area.

6. The transparent flat panel display according to claim 5, wherein the low voltage line includes an opaque metal material.

7. The transparent flat panel display according to claim 1, wherein the emission area includes: a switching thin film transistor, a driving thin film transistor, the sensing thin film transistor, a storage capacitance and the organic light emitting diode, and the data line is connected to a source or a drain of the switching thin film transistor.

8. The transparent flat panel display according to claim 7, wherein the switching thin film transistor, the driving thin film transistor, the sensing thin film transistor and the storage capacitance are disposed under the organic light emitting diode.

9. The transparent flat panel display according to claim 7, wherein the organic light emitting diode includes:
    an anode electrode connected to the driving thin film transistor and including an opaque reflective metal material;
    an organic light emitting layer deposited on the anode electrode; and
    a cathode electrode including a transparent conductive material and deposited on the organic light emitting layer.

* * * * *